United States Patent
Sato

(10) Patent No.: US 12,260,894 B2
(45) Date of Patent: Mar. 25, 2025

(54) VOLTAGE GENERATION CIRCUIT FOR MEMORY DEVICE WITH SERIES CONNECTED RESISTORS

(71) Applicant: Winbond Electronics Corp., Taichung (TW)

(72) Inventor: Takahiko Sato, Yokohama (JP)

(73) Assignee: WINDBOND ELECTRONICS CORP., Taichung (TW)

( * ) Notice: Subject to any disclaimer, the term of this patent is extended or adjusted under 35 U.S.C. 154(b) by 160 days.

(21) Appl. No.: 18/171,024

(22) Filed: Feb. 17, 2023

(65) Prior Publication Data

US 2024/0282356 A1    Aug. 22, 2024

(51) Int. Cl.
*G11C 11/4074* (2006.01)
*G11C 5/14* (2006.01)

(52) U.S. Cl.
CPC .......... *G11C 11/4074* (2013.01); *G11C 5/147* (2013.01); *G11C 5/148* (2013.01)

(58) Field of Classification Search
CPC ...... G11C 11/4074; G11C 5/147; G11C 5/148
See application file for complete search history.

(56) References Cited

U.S. PATENT DOCUMENTS

| | | | |
|---|---|---|---|
| 7,295,051 | B2 | 11/2007 | Li et al. |
| 9,929,644 | B2 * | 3/2018 | Kim ............... H02M 3/07 |
| 2013/0106501 | A1 * | 5/2013 | Yoo ............... G05F 1/56 |
| | | | 323/267 |

FOREIGN PATENT DOCUMENTS

| | | |
|---|---|---|
| CN | 105159379 B | 8/2016 |
| JP | 10-142582 A | 5/1998 |
| TW | I283408 B | 7/2007 |
| TW | 201710822 A | 3/2017 |
| TW | 201806299 A | 2/2018 |
| TW | 201843555 A | 12/2018 |

OTHER PUBLICATIONS

Japanese Office Action for Japanese Application No. 2022-144966, dated Aug. 8, 2023, with English translation.

* cited by examiner

*Primary Examiner* — Sultana Begum
(74) *Attorney, Agent, or Firm* — Birch, Stewart, Kolasch & Birch, LLP

(57) ABSTRACT

A voltage generation circuit and a semiconductor memory device capable of decreasing the layout size and the consumed current are provided. A voltage generation circuit includes a plurality of voltage generation units which generate different output voltages based on an external power supply voltage. Each of the plurality of voltage generation unit comprises a plurality of resistors that are connected in series to detect the output voltages. At least one of these resistors is coupled to and shared by the plurality of voltage generation units.

11 Claims, 6 Drawing Sheets

VOLTAGE GENERATION CIRCUIT FOR MEMORY DEVICE WITH SERIES CONNECTED RESISTORS

BACKGROUND OF THE INVENTION

Field of the Invention

The present invention relates to a voltage generation circuit and semiconductor memory device.

Description of the Related Art

In order to provide power supply voltage to memory elements or circuits in a semiconductor memory device (such as a dynamic random access memory (DRAM), etc.), the use of a voltage stabilizer circuit (the voltage generation unit) to generate an internal voltage based on an external voltage is well known (such as JPH05-74140A).

All memory elements or circuits in a semiconductor memory device are driven by several different power supply voltages, rather than by a single one. Therefore, in order to drive all the memory elements or circuits, it is necessary to dispose a plurality of voltage generation units, which generate different power supply voltages in the semiconductor memory device. As the number of different power supply voltages increases, the number of voltage generation units disposed in the semiconductor memory device also increases, so the layout size increases because of all the space occupied by the voltage generation units in the semiconductor memory device. As the number of voltage generation units increases, the current consumed by the semiconductor memory device may increase.

BRIEF SUMMARY OF THE INVENTION

In view of the above-mentioned problems, the present invention provides a voltage generation circuit and a semiconductor memory device that may decrease the layout size and the consumed current.

An exemplary embodiment of the present invention provides a voltage generation circuit. The voltage generation circuit comprises a plurality of voltage generation units that generate different output voltages based on an input voltage. Each of the plurality of voltage generation units comprises a plurality of resistors that are connected in series to detect the output voltages. At least one of the plurality of resistors is coupled to and shared by the plurality of voltage generation units.

In addition, another exemplary embodiment of the present invention provides a semiconductor memory device that comprises the voltage generation circuit of the above embodiment.

According to the above embodiments, the layout size occupied by each voltage generation unit may decrease, and the power consumption of the semiconductor memory device may also decrease.

According to the voltage generation circuit and the semiconductor memory device provided by the above embodiments of the present invention, the layout size and the consumed current can decrease.

DETAILED DESCRIPTION OF THE INVENTION

Hereinafter, a voltage generation circuit and a semiconductor memory device according to embodiments of the present invention will be described in detail with reference to the accompanying drawings. However, the embodiments are only examples, and the present invention is not limited thereto.

Figure 1:
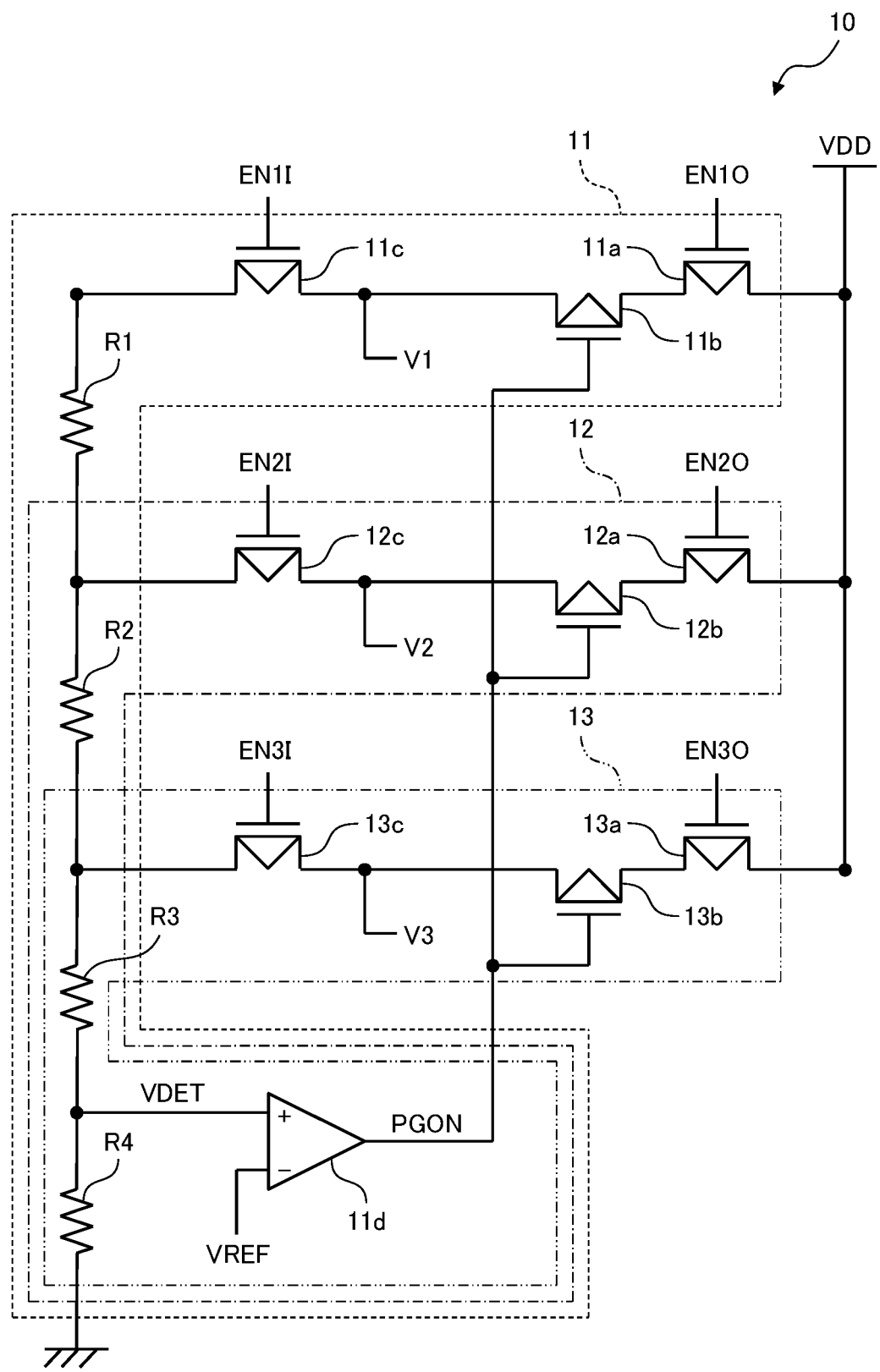
FIG. 1 is a diagram showing a configuration of a voltage generation circuit according to a first embodiment of the present invention.

FIG. 1 is a block diagram of a configuration example of a voltage generation circuit 10 of a semiconductor memory device according to a first embodiment of the present invention. The voltage generation circuit 10 is disposed in a semiconductor memory device (for example, DRAM, etc.) and configured to generate power supply voltages for driving memory elements or circuits in the semiconductor memory device. In the embodiment, the voltage generation circuit 10 comprises a first voltage generation unit 11, a second voltage generation unit 12, a third voltage generation unit 13, and a control unit 14 (shown in FIG. 2). For simplicity of description, other conventional structures of the semiconductor memory device are not shown here, for example, memory cell arrays or instruction decoders, etc.).

In the embodiment, each of the first voltage generation unit 11, the second voltage generation unit 12, and the third voltage generation unit 13 is configured to take an external voltage power supply VDD as an input voltage and generate different output voltages V1, V2, and V3 based on the input voltage (for example, VDD>V1>V2>V3). Specifically, the first voltage generation unit 11 generates the output voltage V1, the second voltage generation unit 12 generates the output voltage V2, and the third voltage generation unit 13 generates the output voltage V3. Although the external voltage supply VDD is taken as the input voltage as an example here, the input voltage may also be one of other voltages excluding the external voltage supply VDD (for example, another voltage generated based on the external voltage supply VDD).

The first voltage generation unit 11 is implemented by a linear voltage regulator. The first voltage generation unit 11 comprises P-type metal-oxide-semiconductor field-effect transistors (MOSFETs) 11a, 11b, and 11c, an error amplifier 11d, and a plurality of resistors R1, R2, R3, and R4 that are coupled in series for detecting the output voltage V1. In the embodiment, the number of the resistors is four.

The MOSFET 11a is disposed between an input terminal of the first voltage generation unit 11 (the terminal that applies the external voltage supply VDD as the input voltage) and an input terminal (the source) of the MOSFET 11b. The MOSFET 11a is turned on by a second control signal EN1O that will be described in the following paragraphs. In addition, the MOSFET 11a is an example of a "second switch unit" of the invention.

The MOSFET 11b is connected between the input terminal of the first voltage generation unit 11 (through the MOSFET 11*a*) and an output terminal used for outputting the output voltage V1. The MOSFET 11*b* is controlled by the error amplifier 11*d*. In addition, the MOSFET 11*b* is an example of an "output driver" of the invention.

The MOSFET 11*c* is disposed between an output terminal (the drain) of the MOSFET 11*b* and the resistors R1, R2, R3, and R4. The MOSFET 11*c* is controlled by a first control signal EN1I that will be described in the following paragraphs. In addition, the MOSFET 11*c* is an example of a "first switch unit" of the invention.

The error amplifier 11*d* is configured to compare a specific reference voltage VREF and a divided voltage VDET that is obtained according to a voltage division between at least one resistor of the resistors R1, R2, R3, and R4 (for example, the resistor R4) and the other resistors thereof (for example, the resistors R1, R2, and R3). The error amplifier 11*d* controls the MOSFET 11*b* based on the comparison result. In addition, the error amplifier 11*d* is an example of "a comparison unit" of the invention.

The resistors R1, R2, R3, and R4 are connected between the output terminal (the drain) of the MOSFET 11*b* (through the MOSFET 11*c*) and a low voltage power supply that is lower than the external voltage supply VDD. In the embodiment, among the resistors R1, R2, R3, and R4, at least one resistor (for example, the resistor R4) is connected between the other resistors (for example, the resistors R1, R2, and R3) and the low voltage power supply, while the other resistors (for example, the resistors R1, R2, and R3) are connected between the output terminal (the drain) of the MOSFET 11*b* (through the MOSFET 11*c*) and the at least one resistor (for example, the resistor R4).

The source of the MOSFET 11*a* is connected to the external voltage supply VDD, and the drain of the MOSFET 11*a* is connected to the source of the MOSFET 11*b*. In addition, the second control signal EN1O is applied to the gate of the MOSFET 11*a*. Furthermore, the drain of the MOSFET 11*b* is connected to the source of the MOSFET 11*c*, and the gate of the MOSFET 11*b* is connected to an output terminal of the error amplifier 11*d*. The drain of the MOSFET 11*c* is connected to one terminal of the resistor R1, and the first control signal EN1I is applied to the gate of the MOSFET 11*c*. The resistors R1, R2, R3, and R4 are sequentially connected in series between the drain of the MOSFET 11*c* and the low power supply voltage. In addition, the node between the resistor R3 and the resistor R4 is connected to one of the input terminals of the error amplifier 11*d*, and the reference voltage VREF is applied to the other one of the input terminals of the error amplifier 11*d*.

The error amplifier 11*d* compares the voltage VDET that is input to one of the input terminals with the reference voltage VREF and outputs the comparison result as a signal PGON that is provided to the MOSFET 11*b*. In the embodiment, in cases where the voltage VDET is less than the reference voltage VREF (VDET<VREF), the error amplifier 11*d* generates the signal PGON and outputs the signal PGON to the MOSFET 11*b*, and the signal PGON causes the on-resistance of the MOSFET 11*b* to decrease (that is, the output voltage V1 increases). In addition, in cases where the voltage VDET is greater than the reference voltage VREF (VDET>VREF), the error amplifier 11*d* generates the signal PGON and outputs the signal PGON to the MOSFET 11*b*, and the signal PGON causes the on-resistance of the MOSFET 11*b* to increase (that is, the output voltage V1 decreases).

The second voltage generation unit 12 is a linear voltage regulator. The second voltage generation unit 12 comprises P-type MOSFETs 12*a*, 12*b*, and 12*c*, an error amplifier 11*d*, and a plurality of resistors R1, R2, and R3 (there are three resistors in the embodiment) that are coupled in series for detecting the output voltage V2. In the embodiment, the second voltage generation unit 12 and the first voltage generation unit 11 share the error amplifier 11*d* and the resistors R2, R3, and R4.

The MOSFET 12*a* is disposed between an input terminal of the second voltage generation unit 12 (the terminal that applies the external voltage supply VDD as the input voltage) and an input terminal (the source) of the MOSFET 12*b*. The MOSFET 12*a* is turned-on by a second control signal EN2O. In addition, the MOSFET 12*a* is an example of a "second switch unit" of the invention.

The MOSFET 12*b* is connected between the input terminal of the second voltage generation unit 12 (through the MOSFET 12*a*) and an output terminal used for outputting the output voltage V2. The MOSFET 12*b* is controlled by the error amplifier 11*d*. In addition, the MOSFET 12*b* is an example of an "output driver" of the invention.

The MOSFET 12*c* is disposed between an output terminal (the drain) of the MOSFET 12*b* and the resistors R2, R3, and R4. The MOSFET 12*c* is controlled by a first control signal EN2I. In addition, the MOSFET 12*c* is an example of a "first switch unit" of the invention.

The error amplifier 11*d* is configured to compare the specific reference voltage VREF and a divided voltage VDET that is obtained according to a voltage division between at least one resistor of the resistors R2, R3, and R4 (for example, the resistor R4) and the other resistors thereof (for example, the resistors R2 and R3). The error amplifier 11*d* controls the MOSFET 12*b* based on the comparison result.

The operations and connections of the resistors R2, R3, and R4 are as mentioned above.

The source of the MOSFET 12*a* is connected to the external voltage supply VDD, and the drain of the MOSFET 12*a* is connected to the source of the MOSFET 12*b*. In addition, the second control signal EN2O is applied to the gate of the MOSFET 12*a*. Furthermore, the drain of the MOSFET 12*b* is connected to the source of the MOSFET 12*c*, and the gate of the MOSFET 12*b* is connected to the output terminal of the error amplifier 11*d*. The drain of the MOSFET 12*c* is connected to one terminal of the resistor R2, and the first control signal EN2I is applied to the gate of the MOSFET 12*c*. The resistors R2, R3, and R4 are sequentially connected in series between the drain of the MOSFET 12*c* and the low power supply voltage.

The error amplifier 11*d* compares the voltage VDET that is input to one of the input terminals with the reference voltage VREF and outputs the comparison result as a signal PGON that is provided to the MOSFET 12*b*. In the embodiment, in cases where the voltage VDET is less than the reference voltage VREF (VDET<VREF), the error amplifier 11*d* generates the signal PGON and outputs the signal PGON to the MOSFET 12*b*, and the signal PGON causes the on-resistance of the MOSFET 12*b* to decrease (that is, the output voltage V2 increases). In addition, in cases where the voltage VDET is greater than the reference voltage VREF (VDET>VREF), the error amplifier 11*d* generates the signal PGON and outputs the signal PGON to the MOSFET 12*b*, and the signal PGON causes the on-resistance of the MOSFET 12*b* to increase (that is, the output voltage V2 decreases).

The third voltage generation unit 13 is a linear voltage regulator. The third voltage generation unit 13 comprises P-type MOSFETs 13*a*, 13*b*, and 13*c*, an error amplifier 11*d*, and a plurality of resistors R3 and R4 (there are two resistors in the embodiment) that are coupled in series for detecting the output voltage V3. In the embodiment, the third voltage generation unit 13, the first voltage generation unit 11, and the second voltage generation unit 12 share the error amplifier 11d and the resistors R3 and R4.

The MOSFET 13a is disposed between an input terminal of the third voltage generation unit 13 (the terminal that applies the external voltage supply VDD as an input voltage) and an input terminal (the source) of the MOSFET 13b. The MOSFET 13a is turned on by a second control signal EN3O. In addition, the MOSFET 13a is an example of a "second switch unit" of the invention.

The MOSFET 13b is connected between the input terminal of the third voltage generation unit 13 (through the MOSFET 13a) and an output terminal used for outputting the output voltage V3. The MOSFET 13b is controlled by the error amplifier 11d. In addition, MOSFET 13b is an example of an "output driver" of the invention.

The MOSFET 13c is disposed between an output terminal (the drain) of the MOSFET 13b and the resistors R3 and R4. The MOSFET 13c is controlled by a first control signal EN3I. In addition, the MOSFET 13c is an example of a "first switch unit" of the invention.

The error amplifier 11d is configured to compare the specific reference voltage VREF and a divided voltage VDET that is obtained according to a voltage division between one of the resistors R3 and R4 (for example, the resistor R4) and the other thereof (for example, the resistor R3). The error amplifier 11d controls the MOSFET 13b based on the comparison result.

The operations and connections of the resistors R3 and R4 are as mentioned above.

The source of the MOSFET 13a is connected to the external voltage supply VDD, and the drain of the MOSFET 13a is connected to the source of the MOSFET 13b. In addition, the second control signal EN3O is applied to the gate of the MOSFET 13a. Furthermore, the drain of the MOSFET 13b is connected to the source of the MOSFET 13c, and the gate of the MOSFET 13b is connected to the output terminal of the error amplifier 11d. The drain of the MOSFET 13c is connected to one end of the resistor R3, and the first control signal EN3I is applied to the gate of the MOSFET 13c. The resistors R3-R4 are sequentially connected in series between the drain of the MOSFET 13c and the low power supply voltage.

The error amplifier 11d compares the voltage VDET that is input to one of the input terminals with the reference voltage VREF. The error amplifier 11d outputs the comparison result as a signal PGON that is provided to the MOSFET 13b. In cases where the voltage VDET is less than reference voltage VREF (VDET<VREF), the error amplifier 11d generates the signal PGON and outputs the signal PGON to the MOSFET 13b, and the signal PGON causes the on-resistance of the MOSFET 13b to decrease (that is, the output voltage V3 increases). In addition, in cases where the voltage VDET is greater than reference voltage VREF (VDET>VREF), the error amplifier 11d generates the signal PGON and outputs the signal PGON to the MOSFET 13b, and the signal PGON causes the on-resistance of the MOSFET 13b to increase (that is, the output voltage V3 decreases).

Next, the configuration of the control unit 14 will be described with reference to FIG. 2. The control unit 14 comprises an oscillator 14a, a counter 14b, and a decoder 14c.

The oscillator 14a generates an oscillation signal OSC at a specific interval and outputs the oscillation signal OSC to the counter 14b.

The counter 14b counts the pulses of the oscillation signal OSC output from the oscillator 14a and outputs a signal CNTV that indicates the count value of the pulses to the decoder 14c. In the invention, whenever the count value of the pulses reaches a specific value (for example, 5), the count value may be reset to an initial value (for example, 0). In addition, the counter 14b counts the pulses of the oscillation signal OSC output from the oscillator 14a and outputs a signal CNTS that indicates the count value of the pulses to an update control unit 15.

The decoder 14c generates the first control signals EN1I, EN2I, and EN3I and the second control signals EN1O, EN2O, and EN3O respectively based on the count value indicated by the signal CNTV and outputs the generated first control signals EN1I, EN2I, and EN3I and the generated second control signals EN1O, EN2O, and EN3O to the first voltage generation unit 11, the second voltage generation unit 12, and the third voltage generation unit 13.

The update control unit 15 is configured to refresh memory cells (not shown in drawings) in the semiconductor memory device every time the count value indicated by the signal CNTS reaches a specific value.

In the embodiment, the control unit 14 may control the driving on any one of the voltage generation units 11, 12, and 13 (for example, the first voltage generation unit 11). Therefore, through the control unit 14, only one of the voltage generation units 11, 12, and 13 (for example, the first voltage generation unit 11) can generate an output voltage (for example, the output voltage V1).

For example, the decoder 14c of the control unit 14 outputs the first control signal EN1I with a low level to the MOSFET 11c of the first voltage generation unit 11 to turn on the MOSFET 11c and further outputs the second control signal EN1O with a low level to the MOSFET 11a of the first voltage generation unit 11 to turn on the MOSFET 11a. At this time, the control unit 14 also outputs the first control signals EN2I and EN3I with high levels to the MOSFET 12c of the second voltage generation unit 12 and the MOSFET 13c of the third voltage generation unit 13 to turn off the MOSFETs 12c and 13c and further outputs the second control signals EN2O and EN3O with high levels to the MOSFET 12a of the second voltage generation unit 12 and the MOSFET 13a of the third voltage generation unit 13 to turn off the MOSFETs 12a and 13a, thereby stopping driving the second voltage generation unit 12 and the third voltage generation unit 13.

In addition, the control unit 14 may switch the driven voltage generation unit among the voltage generation units 11, 12, and 13 at each specific point in time. Therefore, the driven voltage generation unit is changed at each specific point in time.

Furthermore, when the number of pulses of a specific clock signal reaches a specific value, the control unit 14 can switch the driven voltage generation unit among the voltage generation units 11, 12, and 13. Therefore, every time the number of pulses of the specific clock signal reaches the specific value, the driven voltage generation unit can be changed.

For example, the decoder 14c of the control unit 14 may switch the driven voltage generation unit every time the count value indicated by the signal CNTV increases by a certain value (for example, 2). For example, when the driven voltage generation unit is switched to the second voltage generation unit 12 from the first voltage generation unit 11, the decoder 14c outputs the first control signal EN1I that is changed to a high level from the low level to the MOSFET 11c of the first voltage generation unit 11 to turn off the MOSFET 11c and further outputs the second control signal EN1O that is changed to a high level from the low level to the MOSFET 11a of the first voltage generation unit 11 to turn off the MOSFET 11a, thereby stopping driving the first voltage generation unit 11. In addition, the control unit 14 outputs the first control signal EN2I that is changed to a low level from the high level to the MOSFET 12c of the second voltage generation unit 12 to turn on the MOSFET 12c and further outputs the second control signal EN2O that is changed to a low level from the high level to a low level to the MOSFET 12a of the second voltage generation unit 12 to turn on the MOSFET 12a, thereby driving the second voltage generation unit 12. In addition, for example, when the driven voltage generation unit is switched to the third voltage generation unit 13 or the first voltage generation unit 11 from the second voltage generation unit 12, the control unit 14 operates to turn off the MOSFETs 12a and 12c of the second voltage generation unit 12 and turn on the MOSFETs (the MOSFETs 13a and 13c or the MOSFETs 11a and 11c) of the driven voltage generation unit.

In addition, the control unit 14 may switch the driven voltage generation unit among the voltage generation units 11, 12, and 13 in a specific order. Therefore, the driven voltage generation units can be changed in the specific order.

For example, the decoder 14c of the control unit 14 can switch the driven voltage generation unit according to a specific driving order (for example, the order of repeating the first voltage generation unit 11, the second voltage generation unit 12, and the third voltage generation unit 13). In the embodiment, the information about the driving order can be stored in, for example, a mode register (omitted in the drawings) in the semiconductor memory device or a storage circuit disposed in the decoder 14c. In addition, the information about the driving order may be changed at any timing.

Figure 3:
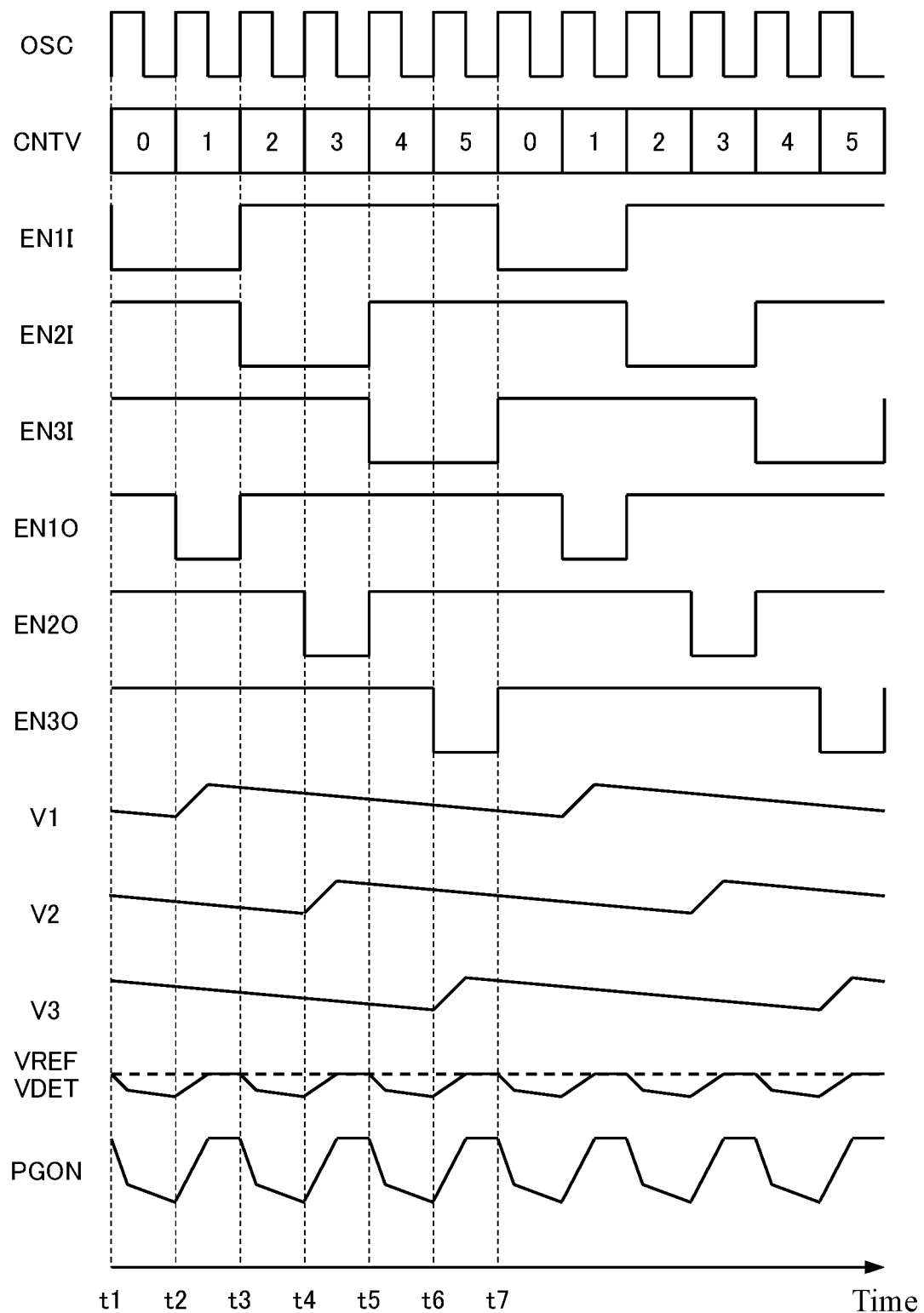
FIG. 3 is a timing chart of signals in a voltage generation circuit.

FIG. 3 is a timing chart showing an example of the operation of the voltage generation circuit 10 according to an embodiment. First, at time t1, when the decoder 14c of the control unit 14 receives the count value (here, it is equal to 0) indicated by the signal CNTV from the counter 14b, the decoder 14c generates the first control signal EN1I with the low level and further generates the first control signals EN2I and EN3I with the high levels and the second control signals EN1O, EN2O, and EN3O with the high levels. Therefore, the MOSFET 11c of the first voltage generation unit 11 is turned on, and the other MOSFETs 11a, 12a, 12c, 13a, and 13c are turned off. Next, at time t2, when the decoder 14c of the control unit 14 receives the count value (here, it is equal to 1) indicated by the signal CNTV from the counter 14b, the decoder 14c generates the first control signal EN1I and the second control signal EN1O with the low levels and further generates the first control signals EN2I and EN3I with the high levels and the second control signals EN2O and EN3O with the high levels. Therefore, the MOSFETs 11a and 11c of the first voltage generation unit 11 are turned on, and then the first voltage generation unit 11 is driven. At this time, the error amplifier 11d generates the signal PGON based on the comparison result between the reference voltage VREF and the voltage VDET (here, VREF>VDET) to decrease the on-resistance of the MOSFET 11b so that the output voltage V1 increases until it reaches a target voltage.

Next, at time t3, when the decoder 14c of the control unit 14 receives the count value (here, it is equal to 2) indicated by the signal CNTV from the counter 14b, the decoder 14c generates the first control signal EN2I with the low level and further generates the first control signal EN1I and EN3I with the high levels and the second control signal EN1O, EN2O, and EN3O with the high levels. Therefore, the MOSFET 12c of the second voltage generation unit 12 is turned on, and the other MOSFETs 11a, 11c, 12a, 13a, and 13c are turned off. Next, at time t4, when the decoder 14c of the control unit 14 receives the count value (here, it is equal to 3) indicated by the signal CNTV from the counter 14b, the decoder 14c generates the first control signal EN2I and the second control signal EN2O with the low levels and further generates the first control signals EN1I and EN3I with the high levels and the second control signals EN1O and EN3O with the high levels. Therefore, the MOSFETs 12a and 12c of the second voltage generation unit 12 are turned on, and then the second voltage generation unit 12 is driven. At this time, the error amplifier 11d generates the signal PGON based on the comparison result between the reference voltage VREF and the voltage VDET (here, VREF>VDET) to decrease the on-resistance of the MOSFET 12b so that the output voltage V2 increases until it reaches the target voltage.

Next, at time t5, when the decoder 14c of the control unit 14 receives the count value (here, it is equal to 4) indicated by the signal CNTV from the decoder 14c, the decoder 14c generates the first control signal EN3I with the low level and further generates the first control signal EN1I and EN2I with the high levels and the second control signal EN1O, EN2O, and EN3O with the high levels. Therefore, the MOSFET 13c of the third voltage generation unit 13 is turned on, and the other MOSFETs 11a, 11c, 12a, 12c, and 13a are turned off. Next, at time t6, when the decoder 14c of the control unit 14 receives the count value (here, it is equal to 5) indicated by the signal CNTV from the counter 14b, the decoder 14c generates the first control signal EN3I and the second control signal EN3O with the low levels and further generates the first control signals EN1I and EN2I with the high levels and the second control signals EN1O and EN2O with the high levels. Therefore, the MOSFETs 13a and 13c of the third voltage generation unit 13 are turned on, and then the third voltage generation unit 13 is driven. At this time, the error amplifier 11d generates the signal PGON based on the comparison result between the reference voltage VREF and the voltage VDET (here, VREF>VDET) to decrease the on-resistance of the MOSFET 13b so that the output voltage V3 increases until it reaches the target voltage.

In addition, after time t7, the operations performed at times t1-t6 are repeated.

Accordingly, the driven voltage generation units among the voltage generation units 11, 12, and 13 can be switched at each specific point in time (in the embodiment, the term "specific point in time" indicates every time point when the number of pulses of the clock signal reaches the specific value).

In the embodiment, the effect of reducing the current consumed by the voltage generation circuit 10 according to the present embodiment will be described. For example, when the reference voltage VREF is 0.8V, the resistance value of the resistor R1 is 200 kΩ, the resistance value of the resistor R2 is 100 kΩ, the resistance value of the resistor R3 is 200 kΩ, and the resistance value of the resistor R4 is 800 kΩ, then each of the output values V1, V2, and V3 are calculated as follows:

$$V1 = VREF \times (R1 + R2 + R3 + R4)/R4 = 1.3 \text{ V}$$

$$V2 = VREF \times (R2 + R3 + R4)/R4 = 1.1 \text{ V}$$

$$V3 = VREF \times (R3 + R4)/R4 = 1.0 \text{ V}$$

In addition, the amount of the current consumed by the error amplifier 11d is 1 µA. When only the output voltage V1 among the output voltages V1, V2, and V3 is generated, the current (not including the supply current) I by the voltage generation circuit 10 can be calculated as follows:

I=the current consumed by the error amplifier 11d+
the current consumed by the resistors of the
first voltage generation unit 11=1 µA+1.3/
1300kΩ=2 µA On the other hand, for example, in cases where the error amplifier 11d and the resistors R1, R2, R3, and R4 are provided independently to each of the voltage generation units 11, 12, and 13 instead of being shared by the voltage generation units 11, 12, and 13, when each of the voltage generation units 11, 12, and 13 generate the output voltages V1, V2, and V3 respectively, the total current I' consumed by the respective voltage generation units 11, 12, and 13 can be calculated as follows:

I'=the current consumed by the error amplifier 11d
of each of the voltage generation units 11,12,
and 13+the current consumed by the resistors of
each of the voltage generation units 11,12, and
13=1 µA×3+1.3V/1300 kΩ1.1V/1100kΩ+1.0V/
1000kΩ=6 µA Therefore, compared with the cases where the error amplifier 11d and the resistors R1, R2, R3, and R4 are provided independently to each of the voltage generation units 11, 12, and 13 instead of being shared by the voltage generation units 11, 12, and 13, the voltage generation circuit 10 provided according to this embodiment can reduce the consumed current to ⅓.

In addition, the driving stop period of each of the voltage generation units 11, 12, and 13 can be set according to, for example, the load current or capacitance of the voltage generation unit. For example, when the load current $I_{OUT}$ is 20 uA, the capacitance $C_{OUT}$ is 2 nF, and the target value dV of the voltage drop during the driving stop is 50 mV, the driving stop period dT_max can be calculated as follows:

$$dT\_max = C_{OUT} \times dV/I_{OUT} = 2 \text{ nF} \times 50 \text{ mV}/20 \text{ µA} = 5 \text{ µs}$$

The calculation result indicates that when the driving stop period is shorter than 5 µs, the voltage drop during the driving stop can be set to a value that is less than 50 mV.

In addition, in order to minimize noise (switching noise) caused by the switching of the driven voltage generation unit, it is preferable to adjust the on-resistances of the MOSFETs 11b, 12b, and 13b of the voltage generation units 11, 12, and 13 to be equal. In the embodiment, the load currents of the voltage generation units 11, 12, and 13 are different in response to the levels of the output voltages. Therefore, for example, when the gate widths of the MOSFETs 11b, 12b, and 13b are determined to be linear in response to the load currents, the on-resistances are set to be equal through adjusting the sizes of the MOSFETs 11b, 12b, and 13b in response to the load currents. For example, when the load current of the first voltage generation unit 11 is four times the load current of the second voltage generation unit 12, the gate width of the MOSFET 11b of the first voltage generation unit 11 can be adjusted to be four times the gate width of MOSFET 12b of the second voltage generation unit 12. Therefore, the noise (switching noise) caused by the switching of the voltage generation units can be minimized.

As described above, in the embodiment, at least one resistor, for example, the resistors R3 and/or R4 among the resistors R1, R2, R3, and R4 are shared by the voltage generation units 11, 12, and 13. In addition, the resistors R2, R3, and R4 are shared by the voltage generation units 11 and 12. Therefore, compared with the cases where the independent resistors R1, R2, R3, and R4 are provided to each of the voltage generation units 11, 12, and 13 instead of being shared by the voltage generation units 11, 12, and 13, since at least one resistor (for example the resistors R3 and/or R4) among the resistors included in each of the voltage generation units 11, 12, and 13 can be shared by the voltage generation units 11, 12, and 13, the layout size occupied by each of the voltage generation units 11, 12, and 13 can decrease, and the current consumed by the semiconductor memory device can also decrease at the same time.

In addition, in the embodiment, the error amplifier 11d is shared by the voltage generation units 11, 12, and 13. Therefore, for example, since a single error amplifier 11d is shared by the voltage generation units 11, 12, and 13, the layout size occupied by each of the voltage generation units 11, 12, and 13 can decrease, and the current consumed by the semiconductor memory device can be decrease at the same time.

A second embodiment of the invention will be described in the following. The difference between the second embodiment and the first embodiment is that at least one voltage generation unit 11 among a plurality of voltage generation units 11, 12, and 13 of the voltage generation circuit 10 of the second embodiment comprises a boosting circuit 11e boosting an input voltage (an external voltage power supply VDD) and generating an output voltage V1. The configuration of the second embodiment different from the first embodiment will be described below.

Figure 4:
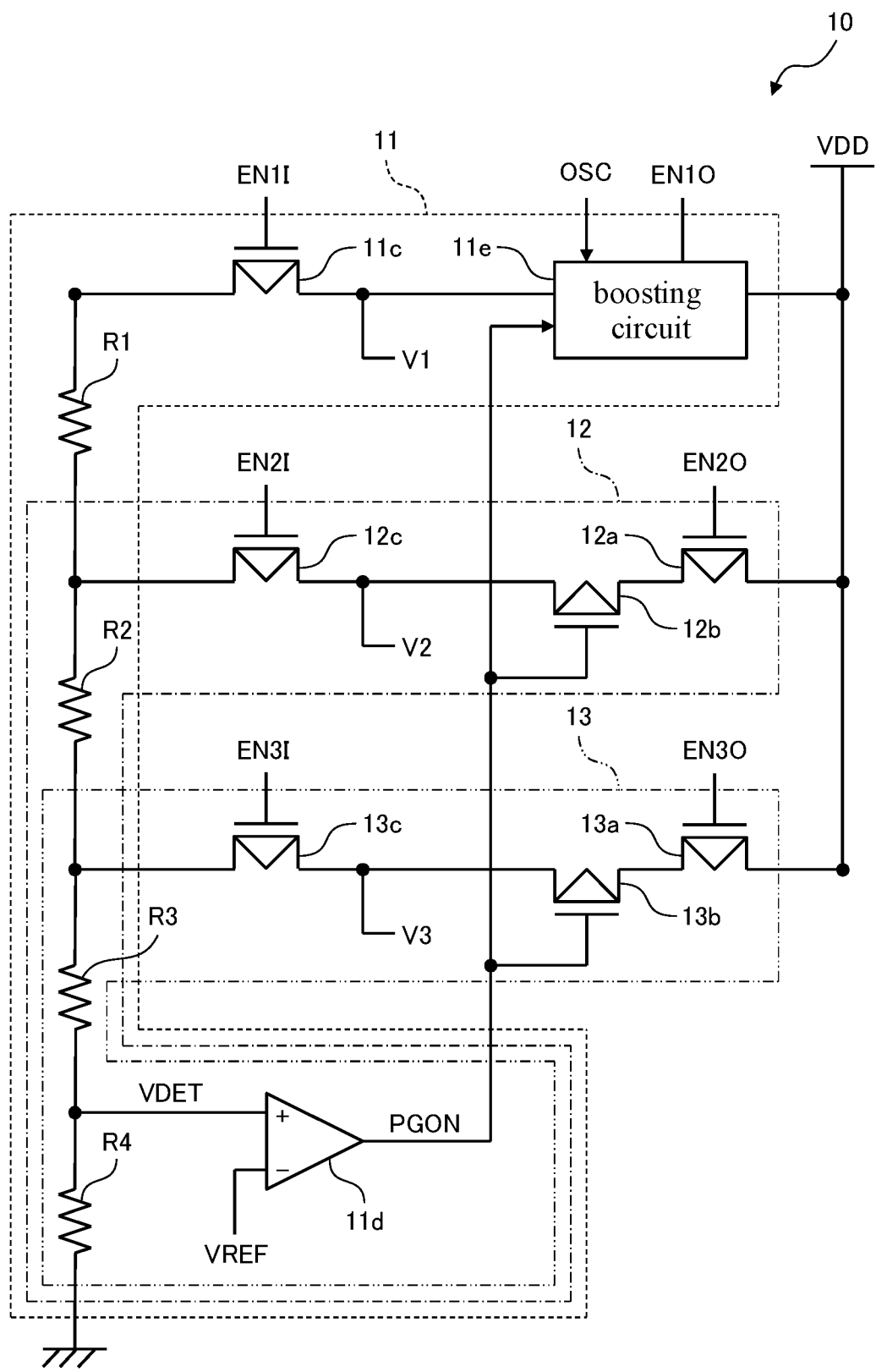
FIG. 4 is a diagram showing a configuration of a voltage generation circuit according to a second embodiment of the present invention.

FIG. 4 is a diagram showing a configuration of the voltage generation circuit 10 according to the second embodiment of the present invention. In the embodiment, the boosting circuit 11e is provided in the first voltage generation unit 11 instead of the MOSFET 11a.

The boosting circuit 11e is configured to boost the input voltage (the external voltage power supply VDD) in response to the oscillation signal OSC output from the oscillator 14a of the control unit 14 to generate an output voltage V1. In the embodiment, in cases where the reference voltage VREF is greater than the voltage VDET (VREF>VDET), the boosting circuit 11e is configured to boost the input voltage when the second control signal EN1O is at the low level. In addition, the boosting circuit 11e can also be formed by a known charge pump.

Figure 5:
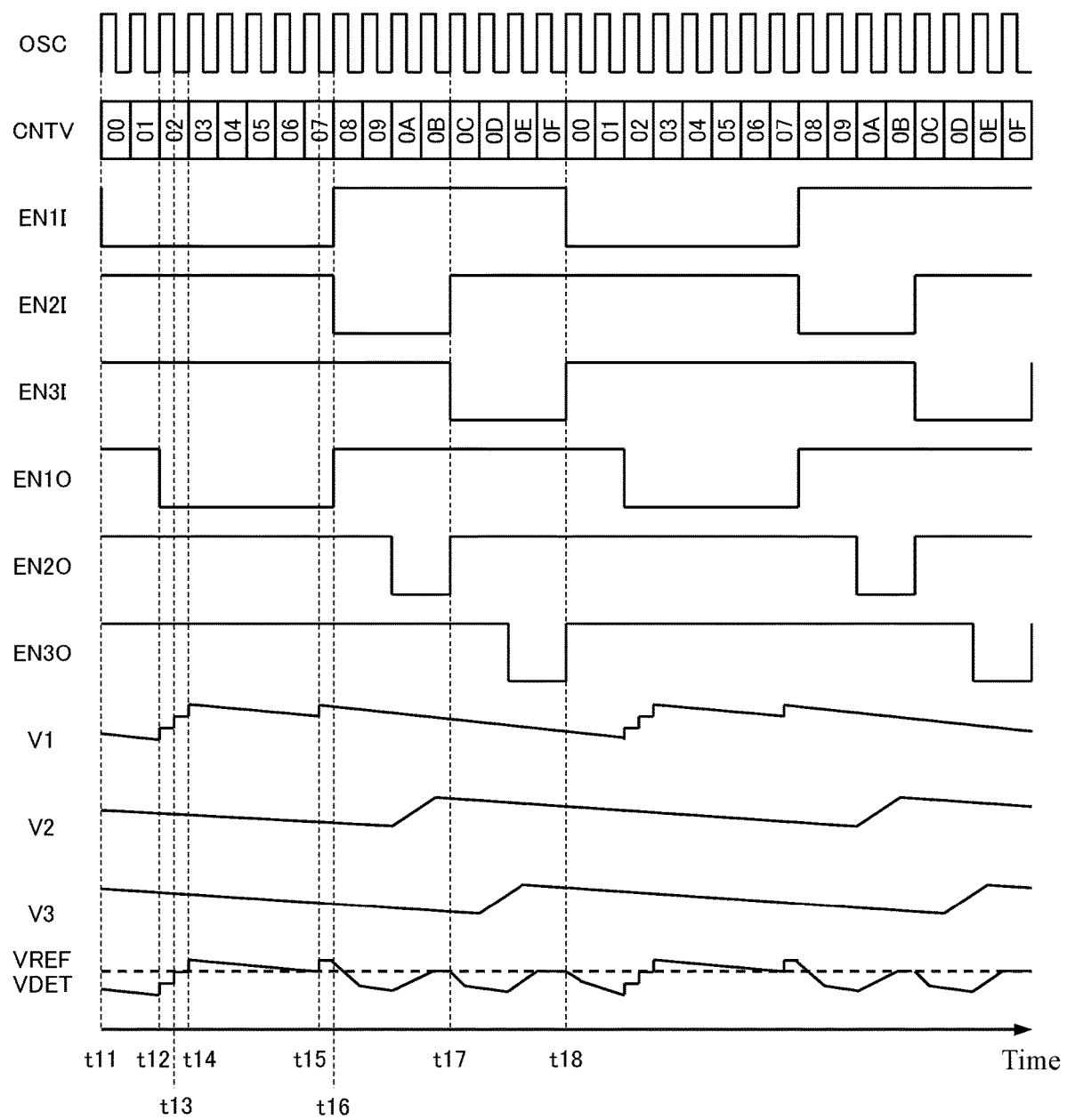
FIG. 5 is a timing chart of signals in a voltage generation circuit.

FIG. 5 is a timing chart showing an example of the operation of the voltage generation circuit 10 according to another embodiment. First, at time t11, when the decoder 14c of the control unit 14 receives the count value (here, it is "00") indicated by the signal CNTV from the counter 14b, the decider 14c generates the first control signal EN1I with the low level and further generates the first control signals EN2I and EN3I with the high levels and the second control signals EN1O, EN2O, and EN3O with the high levels. Therefore, the MOSFET 11c of the first voltage generation unit 11 is turned on, and the other MOSFETs 12a, 12c, 13a, and 13c are turned off. Next, at time t12, when the decoder 14c of the control unit 14 receives the count value (here, it is "02") indicated by the signal CNTV from the counter 14b, the decoder 14c generates the first control signal EN1I and the second control signal EN1O with the low levels and further generates the first control signals EN2I and EN3I with the high levels and the second control signals EN2O and EN3O with the high levels. Therefore, when the boosting circuit 11e of the first voltage generation unit 11 is driven, the MOSFET 11c is turned on, and the first voltage generation unit 11 is driven. At this time, the output voltage V1 increases to the target voltage through boosting the input voltage (the external voltage supply VDD) by the boosting circuit 11e in response to the toggle of the oscillation signal OSC at time t13 and time t14. In addition, the boosting circuit 11e stops the boosting operation when the reference voltage VREF is less than the voltage VDET (VREF<VDET) at time t14. Afterwards, when the reference voltage VREF is greater than the voltage VDET (VREF>VDET) at time t15, the boosting circuit 11e restarts the boosting operation in response to the toggle of the oscillation signal OSC.

Next, at time t16, when the decoder 14c of the control unit 14 receives the count value (here, it is "08") indicated by the signal CNTV from the counter 14b, the decoder 14c generates the first control signal EN2I with the low level and further generates the first control signals EN1I and EN3I with the high levels and the second control signals EN1O, EN2O, and EN3O with the high levels. In addition, the operations at time t16 to time t17 are the same as the operations at time t3 to time t5 shown in FIG. 3.

Next, at time t17, when the decoder 14c of the control unit 14 receives the count value (here, it is "OC") indicated by the signal CNTV from the counter 14b, the decoder 14c generates the first control signal EN3I with the low level and further generates the first control signals EN1I and EN2I with the high levels and the second control signals EN1O, EN2O, and EN3O with the high levels. In addition, the operation from time t17 to time t18 is the same as the operation from time t5 to time t7 shown in FIG. 3.

In addition, after time t18, the operations at time t11 to t17 are repeated.

As described above, according to the voltage generation circuit 10 and the semiconductor memory device of the embodiment, at least one of the voltage generation units 11, 12, and 13 (for example, it may be the first voltage generation unit 11) can generate an output voltage that is higher than the input voltage (the external voltage supply VDD).

In the embodiment, the first voltage generation unit 11 that comprises the boosting circuit 11e is taken as an example, however, the invention is not limited thereto. Instead of the first voltage generation unit 11, the second voltage generation unit 12 or the third voltage generation unit 13 may comprise a boosting circuit. In another embodiment, each of the first voltage generation unit 11, the second voltage generation unit 12, and the third voltage generation unit 13 may comprise a boosting circuit.

The various embodiments described above are described to facilitate understanding of the invention, and the above descriptions are not intended to limit the invention. Therefore, the components disclosed in the above-mentioned embodiments are intended to include all design modification or equivalents within the technical scope of the invention.

Figure 6:
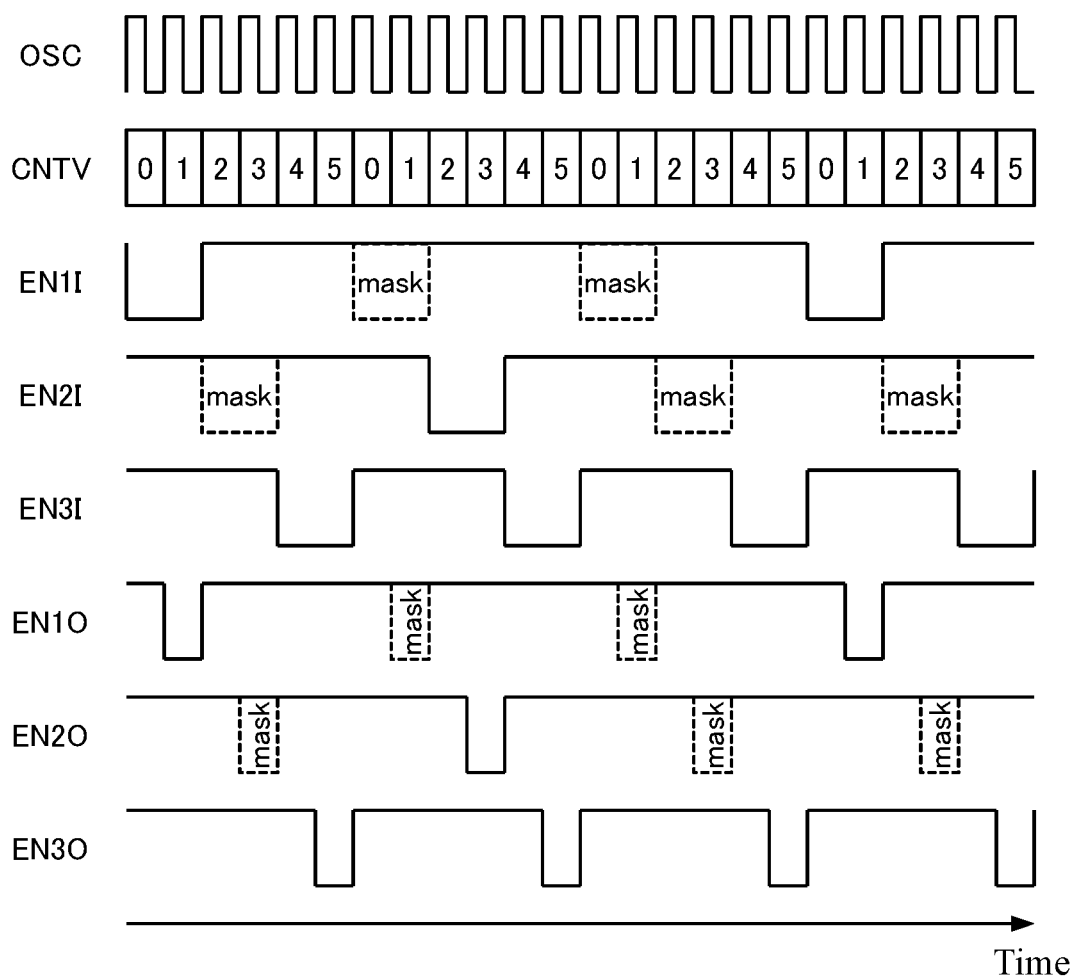
FIG. 6 is a timing chart of signals in a voltage generation circuit according to the modified embodiment.

For example, in the first embodiment, the case where the driven voltage generation unit is switched every time the number of pulses of the clock number of the oscillation signal OSC reaches a specific value (for example, 2) is taken as an example, however, the present invention is not limited thereto. For example, when it is desired to set the driving interval (the voltage generation interval) of any one of the voltage generation units 11, 12, and 13 to be longer than that of the other voltage generation units, as shown in FIG. 6, the first control signals EN1I, EN2I, and EN3I and the second control signals EN1O, EN2O, and EN3O are maintained at the high levels (that is, the driving stop state of the corresponding voltage generation units is maintained) by masking the states in which they change to the low levels. Therefore, the current consumed by the voltage generation circuit 10 can decrease because the driving stop state of the voltage generation units can be easily extended.

In addition, in each of the above-mentioned embodiments, the case where the "output driver", the "first switch unit", and the "second switch unit" of the present invention are composed of P-channel MOSFETs is taken as an example, however, the present invention is not limited thereto. For example, the "output driver", the "first switch unit", and the "second switch unit" may be composed of N-channel MOSFETs, or may be composed of other transistors or switching elements.

Furthermore, in the above-mentioned embodiments, the case where the first voltage generation unit 11, the second voltage generation unit 12, and the third voltage generation unit 13 are linear regulators is taken as an example, however, the present invention is not limited thereto. For example, the first voltage generation unit 11, the second voltage generation unit 12, and the third voltage generation unit 13 may be other regulators, such as switching regulators.

Figure 2:
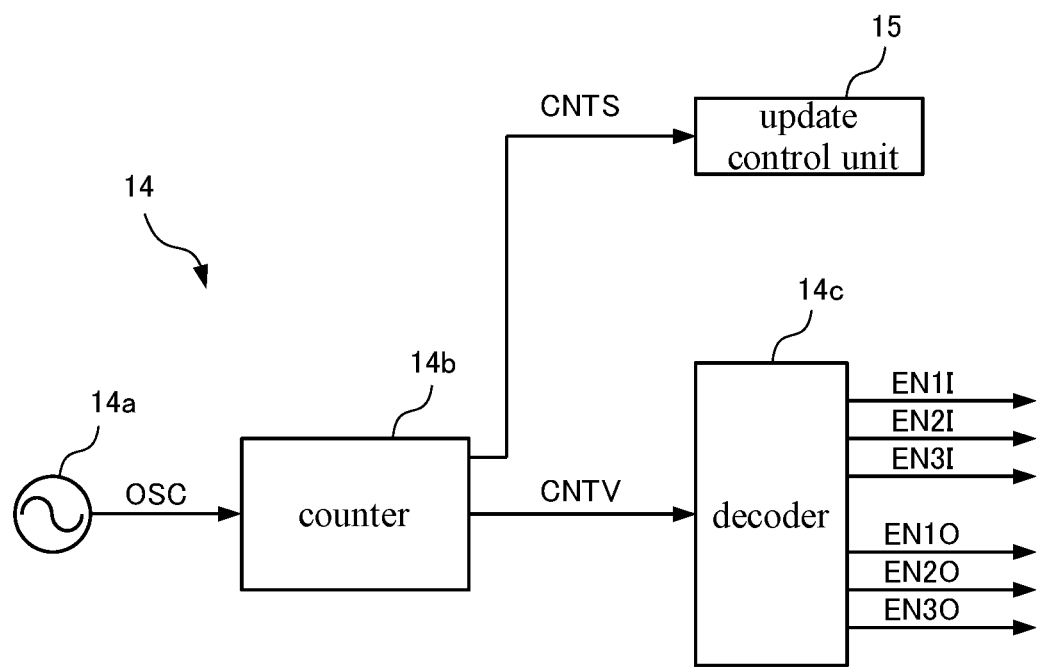
FIG. 2 is a block diagram showing an exemplary embodiment of a configuration of a control unit.

The configurations of the voltage generation circuit 10 and the parts 11-14 shown in FIGS. 1, 2, and 4 are merely examples. They may be appropriately modified or implemented by known configurations or other various configurations.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:
1. A voltage generation circuit comprising:
a plurality of voltage generation units generating different output voltages based on an input voltage,
wherein each of the plurality of voltage generation units comprises;
a plurality of resistors that are connected in series to detect the output voltages,
a comparison unit comparing a specific reference voltage with a divided voltage, wherein the divided voltage is a voltage which is obtained according to a voltage division between the at least one of the plurality of resistors and the others of the plurality of resistors, and
an output driver, connected between an input terminal applying the input voltage and an output terminal outputting the output voltages, controlled by the comparison unit,
wherein the comparison unit is coupled to and shared by the voltage generation units, and
wherein at least one of the plurality of resistors is coupled to and shared by the plurality of voltage generation units.
2. The voltage generation circuit as claimed in claim 1, wherein:
the at least one resistor of the plurality of resistors is connected between the others of the plurality of resistors and a low voltage power supply, and
the others of the plurality of resistors are connected between an output terminal of the output driver and the at least one resistor.

3. The voltage generation circuit as claimed in claim 2, wherein:
the specific reference voltage is applied to one of input terminals of the comparison unit, and
the other of the input terminals of the comparison unit is connected to a node between the at least one of the plurality of resistors and the others of the plurality of resistors.

4. The voltage generation circuit as claimed in claim 2, wherein a first switch unit which is turned on by a specific first control signal is disposed between the output terminal of the output driver and the plurality of resistors.

5. The voltage generation circuit as claimed in claim 2, wherein a second switch unit which is turned on by a specific second control signal is disposed between the input terminal of each of the plurality of voltage generation units and an input terminal of the output driver.

6. The voltage generation circuit as claimed in claim 1, wherein at least one of the plurality of voltage generation units comprises a boosting circuit which boosts the input voltage and generates the output voltage.

7. The voltage generation circuit as claimed in claim 1, further comprising:
a control unit controlling any one of the plurality of voltage generation units to be driven.

8. The voltage generation circuit as claimed in claim 7, wherein the control unit switches the driven voltage generation unit among the plurality of voltage generation units at each specific point in time.

9. The voltage generation circuit as claimed in claim 8, wherein the control unit switches the driven voltage generation unit among the plurality of voltage generation units when the number of pulses of a specific clock signal reaches a specific value.

10. The voltage generation circuit as claimed in claim 7, wherein the control unit switches the driven voltage generation unit among the plurality of voltage generation units in a specific order.

11. A semiconductor memory device comprising the voltage generation circuit as claimed in claim 1.

* * * * *